US008054206B2

(12) United States Patent
Honda

(10) Patent No.: US 8,054,206 B2
(45) Date of Patent: Nov. 8, 2011

(54) DECODING DEVICE AND DECODING METHOD

(75) Inventor: Makoto Honda, Kokubunji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/705,379

(22) Filed: Feb. 12, 2010

(65) Prior Publication Data

US 2010/0231424 A1     Sep. 16, 2010

(30) Foreign Application Priority Data

Mar. 16, 2009  (JP) ................................ P2009-062761

(51) Int. Cl.
  *H03M 7/34*  (2006.01)
(52) U.S. Cl. ................. 341/51; 341/50; 341/65; 341/67; 341/106; 341/107
(58) Field of Classification Search .................... 341/50, 341/51, 65, 67, 106, 107; 375/240, 240.12, 375/240.15; 382/232, 234, 236
See application file for complete search history.

(56) References Cited

U.S. PATENT DOCUMENTS

| | | | | | |
|---|---|---|---|---|---|
| 5,541,595 | A | * | 7/1996 | Meyer | 341/67 |
| 5,742,352 | A | * | 4/1998 | Tsukagoshi | 348/468 |
| 5,945,931 | A | * | 8/1999 | Tahara et al. | 341/50 |
| 6,373,905 | B1 | * | 4/2002 | Yasuda et al. | 375/340 |
| 6,396,874 | B1 | * | 5/2002 | Kato | 375/240.16 |
| 6,400,400 | B1 | * | 6/2002 | Isnardi et al. | 348/180 |
| 6,490,243 | B1 | * | 12/2002 | Tanaka et al. | 370/216 |
| 6,501,901 | B2 | * | 12/2002 | Yasuda et al. | 386/283 |
| 6,809,665 | B2 | * | 10/2004 | Park et al. | 341/67 |
| 6,925,097 | B2 | * | 8/2005 | Hagai et al. | 370/535 |
| 6,965,328 | B2 | * | 11/2005 | Ji | 341/50 |
| 7,129,860 | B2 | * | 10/2006 | Alvarez et al. | 341/51 |
| 7,233,558 | B2 | * | 6/2007 | Lan | 369/53.34 |
| 7,400,685 | B2 | * | 7/2008 | Kato | 375/240.28 |
| 7,605,722 | B2 | * | 10/2009 | Beack et al. | 341/50 |
| 2007/0292110 | A1 | | 12/2007 | Nishi et al. | |
| 2010/0046627 | A1 | * | 2/2010 | Xiao et al. | 375/240.23 |

FOREIGN PATENT DOCUMENTS

| | | |
|---|---|---|
| JP | 2006-033396 | 2/2006 |
| JP | 2007-96615 | 4/2007 |
| WO | WO 2006/025489 A1 | 3/2006 |

OTHER PUBLICATIONS

Office Action issued by the Japanese Patent Office on Jan. 25, 2011, for Japanese Patent Application No. 2009-062761 and English-language translation thereof.

* cited by examiner

*Primary Examiner* — Linh V Nguyen

(74) *Attorney, Agent, or Firm* — Finnegan, Henderson, Farabow, Garrett & Dunner, L.L.P.

(57) ABSTRACT

A decoding method includes: inputting control information including first and second codec identifiers identifying first and second codecs corresponding to first and second material data, respectively, and first and second time information representing start times of decoding of the first and second material data, respectively; loading corresponding to the first codec identifier the first codec into the first decode processing unit; starting in the first decode processing unit corresponding to the first time information decoding of the first material data; and loading corresponding to the second codec identifier the second codec into the second decode processing unit.

8 Claims, 2 Drawing Sheets

FIG. 2
| MATERIAL | CODEC | DECODING START TIME |
|---|---|---|
| MATERIAL 1 | CODEC 1 | TIME 1 |
| MATERIAL 2 | CODEC 2 | TIME 2 |
| MATERIAL 3 | CODEC 3 | TIME 3 |
| ⋮ | ⋮ | ⋮ |
FIG. 3
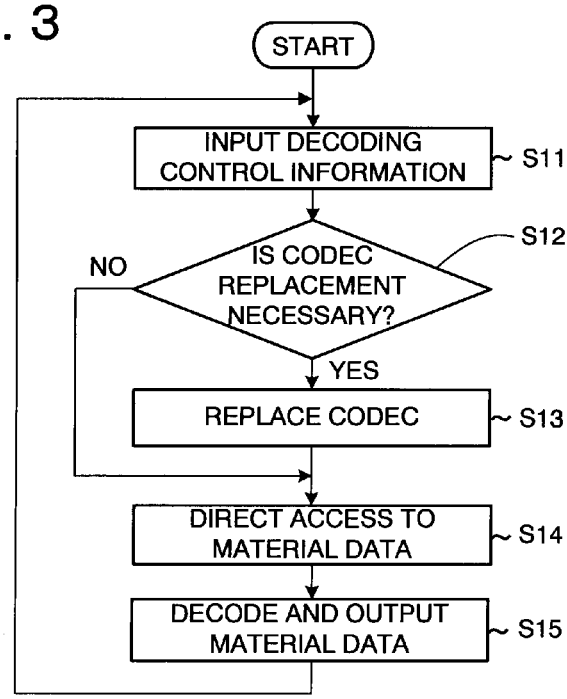
FIG. 4
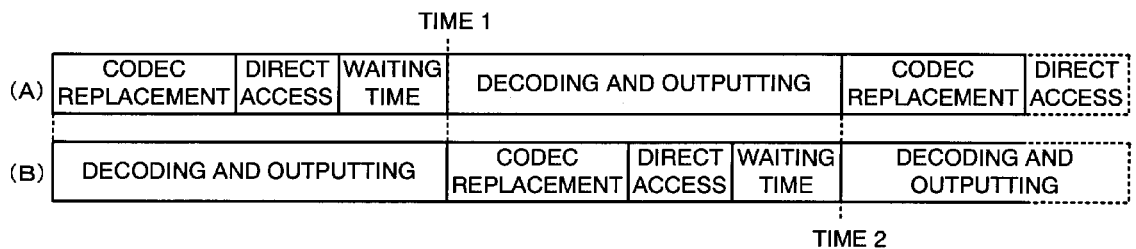

DECODING DEVICE AND DECODING METHOD

CROSS-REFERENCE TO RELATED APPLICATIONS

This application is based upon and claims the benefit of priority from the prior Japanese Patent Application No. 2009-62761, filed on Mar. 16, 2009; the entire contents of which are incorporated herein by reference.

BACKGROUND OF THE INVENTION

Field of the Invention

The present invention relates to a decoding device and a decoding method for selecting a plurality of codecs and decoding data.

Visual and audio data are appropriately encoded and stored, and decoded and used. Here, various methods exist for encoding (for example, MPEG-2, H.264). Accordingly, for decoding, it is necessary to select a codec that corresponds to an encoding method.

Incidentally, a technique to select a codec corresponding to the condition of a network for transmitting data has been disclosed (see JP-A 2006-33396 (KOKAI)).

Here, when sequentially decoding a plurality of data encoded by different encoding methods, switching of codecs is necessary. In this case, switching of codecs may take time, and a blank time in which no data is decoded may occur while decoding the plurality of data.

BRIEF SUMMARY OF THE INVENTION

The present invention has an object to provide a decoding device and a decoding method preventing occurrence of a blank time due to switching of codecs.

A decoding device according to an aspect of the present invention includes: first and second decode processing units decoding data; a load processing unit storing a plurality of different codecs and loading codecs into the first and second decode processing units; an input unit inputting control information including first and second codec identifiers identifying first and second codecs corresponding to first and second material data, respectively, and first and second time information representing start times of decoding of the first and second material data, respectively; a first control unit controlling the load processing unit corresponding to the first codec identifier to load the first codec into the first decode processing unit; a second control unit controlling the first decode processing unit corresponding to the first time information to start decoding of the first material data; and a third control unit controlling the load processing unit corresponding to the second codec identifier to load the second codec into the second decode processing unit.

A decoding method according to another aspect of the present invention is a decoding method in a decoding device having first and second decode processing units decoding data and includes: inputting control information including first and second codec identifiers identifying first and second codecs corresponding to first and second material data, respectively, and first and second time information representing start times of decoding of the first and second material data, respectively; loading corresponding to the first codec identifier the first codec into the first decode processing unit; starting in the first decode processing unit corresponding to the first time information decoding of the first material data; and loading corresponding to the second codec identifier the second codec into the second decode processing unit.

BRIEF DESCRIPTION OF THE DRAWINGS

FIG. 2 is a schematic diagram illustrating an example of decoding control information inputted to a decoding device 30 from an APC 20.

FIG. 3 is a flowchart illustrating an example of an operation procedure of the broadcast system 100.

FIG. 4 is a schematic diagram illustrating temporal transition of processing contents of decode processing units 33A, 33B when the broadcast system 100 operates following the procedure of FIG. 3.

DETAILED DESCRIPTION OF THE INVENTION

Figure 1:
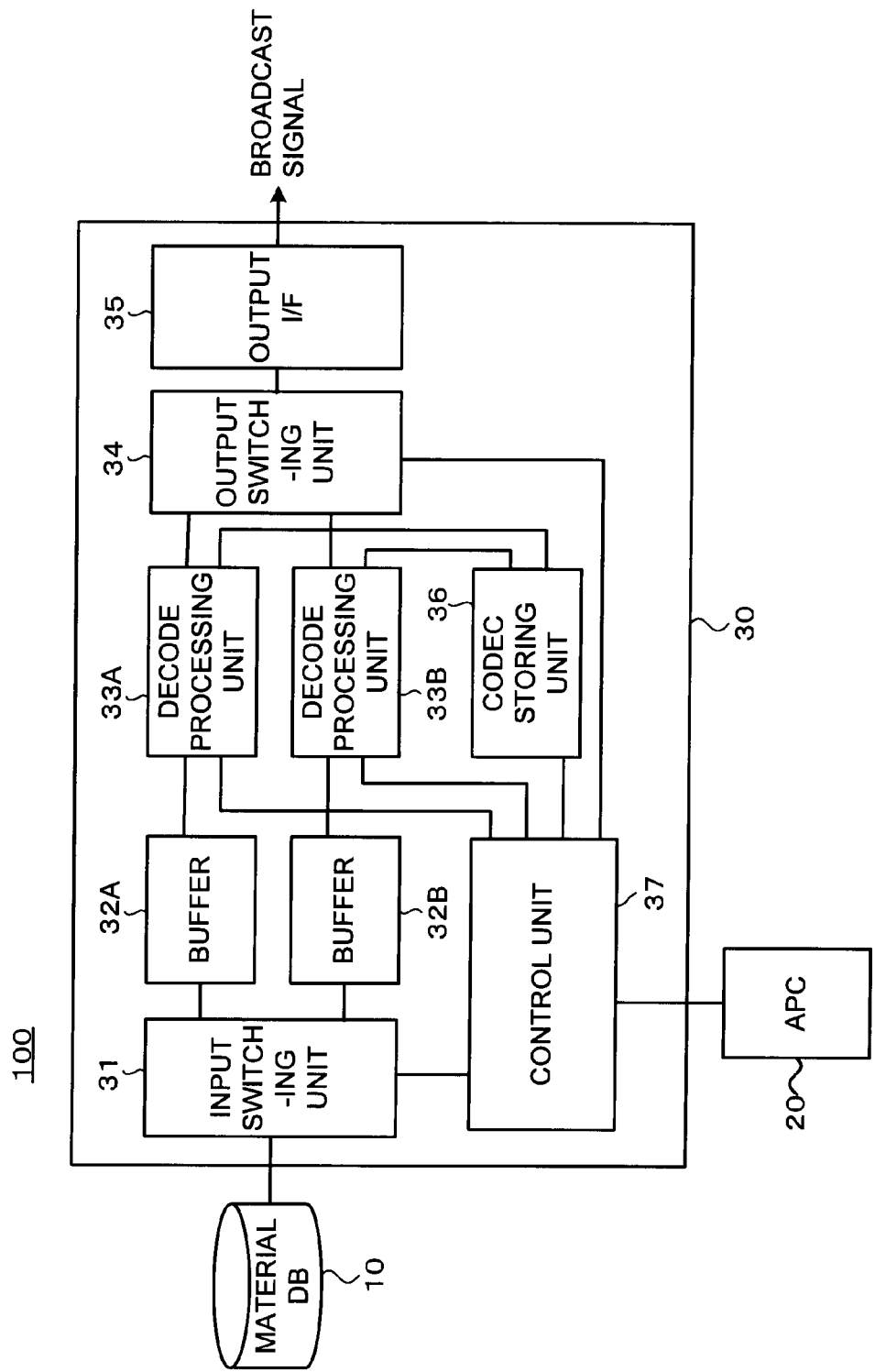
FIG. 1 is a block diagram illustrating a broadcast system 100 according to an embodiment of the present invention.

Hereinafter, an embodiment of the present invention will be described in detail with reference to the drawings.

FIG. 1 is a block diagram illustrating a broadcast system 100 according to an embodiment of the present invention. The broadcast system 100 decodes material data sequentially and outputs a broadcast signal, and has a material DB (database) 10, an APC 20, and a decoding device 30.

The material DB 10 stores material data used as materials of a broadcast program. The material data are visual/audio data and encoded by various codecs (for example, codecs such as MPEG-2, H.264, Microsoft Video 1, Motion JPEG, and the like).

The APC (Automatic Program Controller) 20 performs control for transmission of a program based on programming data. Here, the APC 20 outputs decoding control information for controlling the decoding device 30. FIG. 2 is a schematic diagram illustrating an example of decoding control information inputted to the decoding device 30 from the APC 20.

This decoding control information includes information representing materials, codecs, and decoding start times in an associated manner as follows. The materials and the codecs are represented by material identifiers and codec identifiers, respectively.

(1) Material identifiers: information identifying material data to be an object of decoding (2) Codec identifiers: information identifying codecs for decoding the material data represented by the material identifiers (3) Information representing start times of decoding The decoding device 30 decodes material data outputted from the material DB 10 and outputs the data as a broadcast signal, and has an input switching unit 31, buffers 32A, 32B, decode processing units 33A, 33B, an output switching unit 34, an output I/F (interface) 35, a codec storing unit 36, and a control unit 37.

The input switching unit 31 is controlled by the control unit 37 and switches which of the buffers 32A, 32B (decode processing units 33A, 33B) the material data from the material DB 10 are to be inputted to.

The buffers 32A, 32B are provided for parallel processing in the decode processing units 33A, 33B. For example, by storing part or all of the material data 1, 2 in the buffers 32A, 32B, respectively, decoding of the material 1 in the decode processing unit 33A and direct accessing to the material 2 in the decode processing unit 33B can be performed in parallel.

The decode processing units 33A, 33B use codecs to decode material data from the material DB 10. In the decode processing units 33A, 33B, the codecs can be replaced (or are loadable) dynamically. Prior to decoding of material data, an appropriate codec for material data is loaded if necessary. The two decode processing units 33A, 33B are used to switch codecs alternately. Thus, when a codec is switched in one of the decode processing units 33A, 33B, decoding in the other of the decode processing units 33A, 33B is possible.

The output switching unit 34 is controlled by the control unit 37 and switches which of the decode processing units 33A, 33B is connected to the output I/F 35. That is, the output switching unit 34 switches which of decoded data from the decode processing units 33A, 33B are to be outputted.

The output I/F (interface) 35 outputs decoded data from the output switching unit 34 as a broadcast signal to the outside. This broadcast signal is used as a broadcast wave (for example, a broadcast wave of a digital television broadcast) by predetermined processing thereafter for broadcasting.

The codec storing unit 36 stores a plurality of codecs and is controlled by the control unit 37 to replace codecs of the decode processing units 33A, 33B (loading of codecs). The codec storing unit 36 functions as a load processing unit storing a plurality of different codecs and loading codecs into the first and second decode processing units.

The control unit 37 controls the input switching unit 31, the decode processing units 33A, 33B, the output switching unit 34, and the codec storing unit 36. The control unit 37 can be constituted of a CPU (Central Processing Unit) and software. The control unit 37 functions as the following elements (1) to (6).

(1) Input unit inputting control information including first and second codec identifiers identifying first and second codecs corresponding to first and second material data, respectively, and first and second time information representing start times of decoding of the first and second material data, respectively (2) First control unit controlling the load processing unit corresponding to the first codec identifier to load the first codec into the first decode processing unit (3) Second control unit controlling the first decode processing unit corresponding to the first time information to start decoding of the first material data (4) Third control unit controlling the load processing unit corresponding to the second codec identifier to load the second codec into the second decode processing unit (5) Fourth control unit controlling the second decode processing unit corresponding to the second time information to start decoding of the second material data (6) Determination unit comparing codecs loaded in the first and second decode processing units and the codec corresponding to the second codec identifier and determining whether or not to load the second codec into one of the first and the second decode processing units (Operations of the Broadcast System 100)

Hereinafter, operations of the broadcast system 100 will be described. FIG. 3 is a flowchart illustrating an example of an operation procedure of the broadcast system 100. FIG. 4 is a schematic diagram illustrating temporal transition of processing contents of the decode processing units 33A, 33B when the broadcast system 100 operates following the procedure of FIG. 3. Symbols (A), (B) correspond to the decode processing units 33A, 33B, respectively.

(1) Input of Decoding Control Information (Step S11)

The decoding control information is inputted to the decoding device 30 from the APC 20. As already described, the decoding control information includes the material identifiers, the codec identifiers, and the codec start times. In this example, as shown in FIG. 2, materials 1 to 3 are decoded sequentially with codecs 1 to 3, respectively (times 1 to 3).

(2) Determination of Necessity of Codec Replacement (Step S12)

The control unit 37 determines necessity of codec replacement in the decode processing units 33A, 33B. When either of the codecs loaded in the decode processing units 33A, 33B is the codec 1 corresponding to the material 1, codec replacement is unnecessary. On the other hand, when neither of the codecs loaded in the decode processing units 33A, 33B is the codec 1 corresponding to the material 1, codec replacement is necessary.

(3) Codec Replacement (Step S13)

When it is determined in step S12 that codec replacement is necessary, codec replacement is performed in the decode processing units 33A, 33B.

At this time, it is determined which of the codecs in the decode processing units 33A, 33B is a target of replacement. When neither of the decode processing units 33A, 33B is decoding, one of the decode processing units 33A, 33B is selected arbitrarily as the target of replacement. When one of the decode processing units 33A, 33B is decoding, the other of the decode processing units 33A, 33B is selected as the target of replacement.

Here, as shown in FIG. 4, it is assumed that the decode processing unit 33B is decoding. Consequently, the decode processing unit 33A is selected as the target of codec replacement, and the codec 1 is loaded. As shown in FIG. 4, even while the codec is being replaced in the decode processing unit 33A, decoding in the decode processing unit 33B can be continued.

(4) Direct Access to Material Data (Step S14)

Direct access to material data in the decode processing units 33A, 33B is performed. Here, direct access to the material data 1 is performed in the decode processing unit 33A. Part or all of the material data 1 are inputted to and stored in the buffer 32A from the material DB 10 via the input switching unit 31, and a predetermined part of the material data 1 is arranged at the head of the buffer 32A. In this manner, when decoding the material data 1, decoding is started from this predetermined position. Normally, the head of the material data 1 is this predetermined position (decoding start position). When decoding is started from a position different from the head of the material data 1, information of this position (decoding start position information) may be included in the decoding control information.

As already described, when direct access to material data is performed in the decode processing unit 33A, decoding in the decode processing unit 33B can be continued. When inputting material data to the buffer 32A, input of material data to the buffer 32B is not performed. However, by the decode processing unit 33B, material data accumulated in the buffer 32B can be decoded. The transfer rate of data from the material DB 10 to the buffers 32A, 32B is higher than the decoding rate in the decode processing units 33A, 33B. Accordingly, when data are not transferred from the material DB 10 to the buffers 32A, 32B, decoding in the decode processing units 33A, 33B can be continued.

Incidentally, when the entire material data are accumulated in the buffers 32A, 32B, it will suffice to transfer material data from the material DB 10 only when direct access to the material data is performed.

(5) Decode and Output Material Data (Step S15)

After waiting until a decoding start time, decoding of material data in the decode processing units 33A, 33B is started. Here, decoding of the material data 1 in the decode processing unit 33A is started at time 1. As already described, decoding is started from the decoding start position of the material 1.

Regarding the material 2, codec replacement and direct access to material data in the decode processing unit 33B are performed while decoding material data in the decode processing unit 33A. Then decoding of the material data 2 in the decode processing unit 33B is started at time t2.

As described above, in this embodiment, the two decode processing units 33A, 33B are used to switch codecs alternately. Thus, when a codec is switched in one of the decode processing units 33A, 33B, decoding in the other of the decode processing units 33A, 33B is possible.

Other Embodiments

Embodiments of the present invention are not limited to the above-described embodiment and can be extended and/or changed. Such extended and/or changed embodiments are also included in the technical scope of the present invention. In the above-described embodiment, the codec identifiers are inputted from the APC 20. Alternatively, a codec identifier may be included in the header of material data, and a codec may be selected using this identifier.

What is claimed is:

1. A decoding device, comprising:
   first and second decode processing units decoding data;
   a load processing unit storing a plurality of different codecs and loading codecs into the first and second decode processing units;
   an input unit inputting control information including first and second codec identifiers identifying first and second codecs corresponding to first and second material data, respectively, and first and second time information representing start times of decoding of the first and second material data, respectively;
   a first control unit controlling the load processing unit corresponding to the first codec identifier to load the first codec into the first decode processing unit;
   a second control unit controlling the first decode processing unit corresponding to the first time information to start decoding of the first material data; and
   a third control unit controlling the load processing unit corresponding to the second codec identifier to load the second codec into the second decode processing unit.

2. The decoding device according to claim 1,
   wherein decoding of the first material data in the first decode processing unit and loading of the second codec into the second decode processing unit are performed in parallel.

3. The decoding device according to claim 1, further comprising,
   a determination unit comparing codecs loaded in the first and second decode processing units and the codec corresponding to the second codec identifier and determining whether or not to load the second codec into one of the first and the second decode processing units.

4. The decoding device according to claim 1, further comprising,
   a fourth control unit controlling the second decode processing unit corresponding to the second time information to start decoding of the second material data.

5. A decoding method in a decoding device having first and second decode processing units decoding data, the decoding method, comprising:
   inputting control information including first and second codec identifiers identifying first and second codecs corresponding to first and second material data, respectively, and first and second time information representing start times of decoding of the first and second material data, respectively;
   loading corresponding to the first codec identifier the first codec into the first decode processing unit;
   starting in the first decode processing unit corresponding to the first time information decoding of the first material data; and
   loading corresponding to the second codec identifier the second codec into the second decode processing unit.

6. The decoding method according to claim 5,
   wherein decoding of the first material data in the starting of the decoding and loading of the second codec in the loading are performed in parallel.

7. The decoding method according to claim 5, further comprising,
   comparing codecs loaded in the first and second decode processing units and the codec corresponding to the second codec identifier and determining whether or not to load the second codec into one of the first and the second decode processing units.

8. The decoding method according to claim 5, further comprising,
   starting corresponding to the second time information decoding of the second material data.

* * * * *